United States Patent
Goossen et al.

(10) Patent No.: US 6,388,322 B1
(45) Date of Patent: May 14, 2002

(54) ARTICLE COMPRISING A MECHANICALLY COMPLIANT BUMP

(75) Inventors: Keith W. Goossen, Howell; William Y. Jan, Scotch Plains, both of NJ (US)

(73) Assignee: Aralight, Inc., Jamesburgy, NJ (US)

( * ) Notice: Subject to any disclaimer, the term of this patent is extended or adjusted under 35 U.S.C. 154(b) by 0 days.

(21) Appl. No.: 09/764,192

(22) Filed: Jan. 17, 2001

(51) Int. Cl.$^7$ ............................................. H01L 21/302
(52) U.S. Cl. ..................... 257/737; 257/738; 257/773; 257/775; 257/779; 257/780; 438/613; 438/614
(58) Field of Search ................................. 257/737, 738, 257/773, 775, 779, 780; 438/613, 614

(56) References Cited

U.S. PATENT DOCUMENTS 5,889,326 A * 3/1999 Tanaka ........................ 257/737
5,998,875 A * 12/1999 Bodo et al. ................. 257/778
6,232,669 B1 * 5/2001 Khoury et al. .............. 257/773

* cited by examiner

*Primary Examiner*—John F. Niebling
*Assistant Examiner*—Lynne Gurley
(74) *Attorney, Agent, or Firm*—DeMont & Breyer, LLC; Wayne S. Breyer; Jason Paul DeMont (57) ABSTRACT

Mechanically compliant bumps for flip-chip bonding have a base that is deposited, for example, on the contact pad of a semiconductor chip. A thin wall depends from the periphery of the upper surface of base. The wall advantageously completely encircles the upper surface of the mechanically compliant bump. The wall, which is capable of flexing or deforming under pressure provides mechanical compliance. The wall is able to flex or deform under pressure even if the bump is formed from high-temperature metal. These mechanically compliant bumps facilitate sound electrical connections even when an electronics device is brought into contact for bonding out of parallel.

18 Claims, 7 Drawing Sheets

ARTICLE COMPRISING A MECHANICALLY COMPLIANT BUMP

FIELD OF THE INVENTION

The present invention pertains generally to flip-chip bonding, and more particularly to a mechanically compliant bump for use in flip-chip bonding.

BACKGROUND OF THE INVENTION

"Flip-chip" and "flip-chip bonding" refer to an assembly and method wherein a chip is attached to a substrate, which is typically another chip or a circuit board, such that chip surface (the active area or I/O side) faces the substrate. See, generally, J. H. Lau, *Low Cost Flip Chip Technologies for DCA, WLCSP, and PBGA Assemblies* (McGraw-Hill, ©2000).

Flip-chip bonding addresses two broad classes of problems. One pertains to traditional electronic packaging issues (hereinafter "packaging applications,") such as how to increase packaging efficiency (e.g., cost considerations, performance considerations, etc.). The second pertains to how to integrate two dissimilar electronic devices, such as a photonics device to a silicon-electronics chip, to form a functionally unified device (hereinafter "chip-on-chip applications").

For packaging applications, the two electronics parts being bonded together are usually a semiconductor chip and a circuit board. Compared to the alternative—face-up wire bonding technology—the application of flip-chip technology to electronics packaging provides higher packaging density (e.g., more input/output), potentially shorter leads, lower inductance, better noise control, smaller device footprints, a lower packaging profile and is well suited for use with area array technology.

A variety of interconnect materials and methods can be used in flip-chip bonding, including, for example, tape automated bonding, wire interconnects, isotropic and anisotropic conductive adhesives, bumps, and pressure contacts. Bumps are becoming the interconnection method of choice for a number of applications.

For packaging applications, the flip-chip bonding process with bumps comprises, in pertinent part, depositing a bump of metal on each of a plurality of contact pads that are disposed on the surface of the parts (more properly, on the surface of a wafer at this stage of the method). This step, referred to as "wafer bumping," is performed using any of a variety of known techniques, including evaporation, electroplating, stencil printing and jet printing, to name a few. After deposition, the bump is heated to its melting temperature in a step called "reflow." During reflow, the bump assumes a semi-spherical shape due to the surface tension of the metal. In a so-called "tacking" operation, the bumps on the two parts are aligned and then pressed together forming an assemblage of the two parts.

Even though tacking is performed below the melting point of the bumps, bonding does occur. But to assure electrical connection in a large percentage of the bonds, further processing is desirable. To that end, after tacking, the assemblage is heated to the melting temperature of the bumps. As the bumps melt in a second reflow step, they co-mingle or weld, forming sound electrical connections in high yield.

The bumps for packaging applications are relatively large (c.a., about 100 microns) because of limitations pertaining to forming reflowed bumps. Bump pitch (i.e., spacing between the bumps) is similarly large since reflow might otherwise cause bridging (i.e., flow of metal) between adjacent bumps.

For "chip-on-chip" applications, flip-chip bonding with bumps provides the only commercially practical solution, at least in some cases. For example, it is very inconvenient, using wire bonding, to integrate two-dimensional arrays of devices (e.g, a focal plane array chip containing detectors) to a silicon-electronics chip containing, for example, electronic read-out, driver and/or processing circuitry. The bump and bump pitch are typically much smaller (c.a., 10–20 microns) for chip-on-chip applications than for packaging applications to allow for maximum device density and maximum I/O, as is often necessary.

Typically, a photolithographic lift-off technique is used to form bumps for both packaging and chip-on-chip applications. This technique, well known in the art, is described briefly below in conjunction with FIGS. 1–3.

Figure 1:
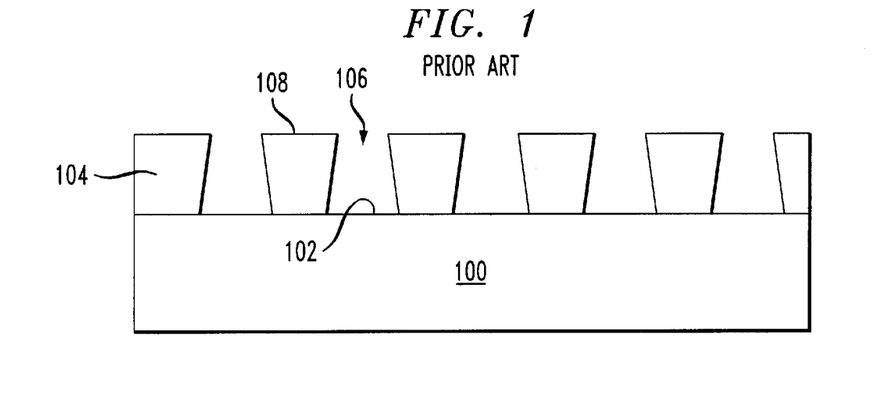
FIG. 1 depicts a cross-sectional view of a wafer with resist deposited thereon and patterned for metal deposition, in accordance with the prior art.
Figure 2:
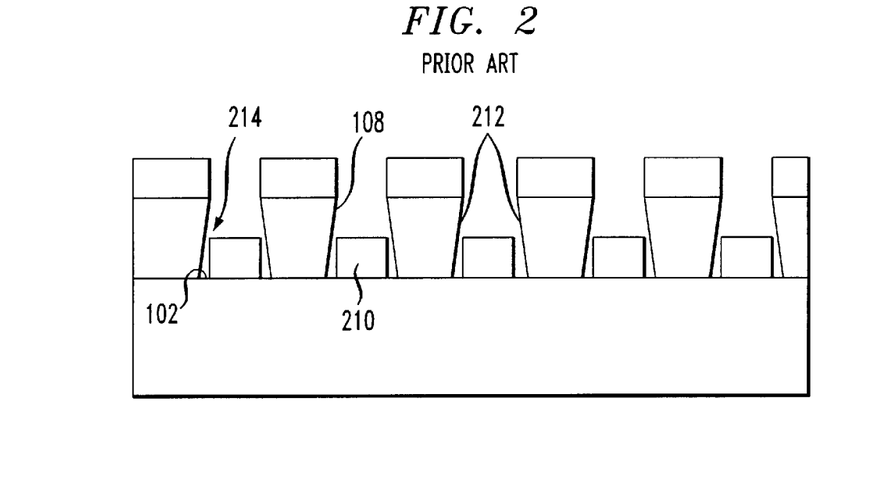
FIG. 2 depicts a cross-sectional view of the wafer of FIG. 1 with metal deposited thereon.

FIG. 1 depicts, via a cross-sectional view, wafer 100 with resist 104 deposited thereon. In this illustration, resist 104 has already been patterned to define a plurality of openings 106 that extend from resist upper surface 108 through to wafer surface 102. Metal is deposited through opening 106 on surface 102 to form bumps 210, as shown in FIG. 2. Metal also deposits on resist upper surface 108.

Figure 3:
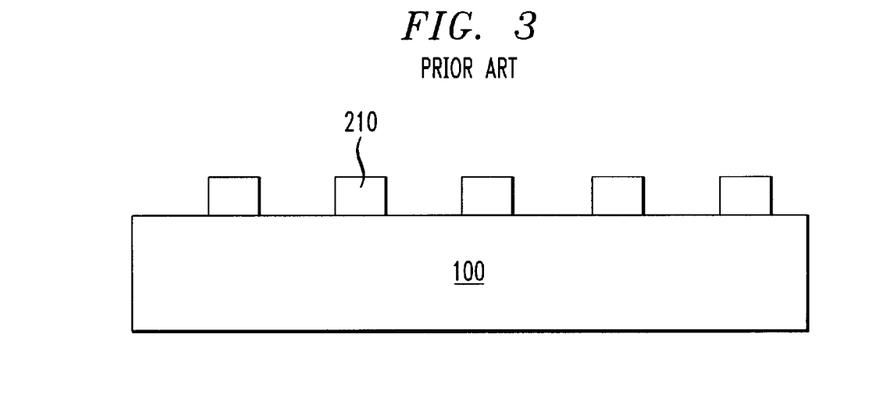
FIG. 3 depicts a cross-sectional view of the wafer of FIG. 2 with the resist and overlying metal removed.

Opening 106 are wider near wafer surface 102 than at resist upper surface 108, thereby creating tapered side-walls 212. Tapering the side-walls in this fashion prevents metal from coating them. The prior art teaches that side-walls 212 must be substantially metal-free to allow resist-removing solvent to penetrate to wafer surface 102 via gap 214. FIG. 3 depicts wafer 100 with resist 104 (and the overlying metal) removed leaving bumps 210.

Any type (e.g., composition, size, etc.) of metal bump can be formed using this technique, given sufficient consideration of the adhesion of the metal to the wafer. For chip-on-chip applications, a soft metal or low-temperature metal is typically used. For the purposes of this specification, the phrases "soft metal" and "low-temperature metal" mean metal(s) or metal alloys having a melting point less than about 400 ° C. Illustrative low temperature metals include, without limitation, indium compositions, and certain alloys of tin, bismuth and zinc.

There are several reasons why soft metals are used for chip-on-chip applications. First, the small bump size and pitch characteristic of chip-on-chip applications increase the likelihood that bridging might occur between adjacent bumps during reflow. Consequently, following tacking, the temperature is not raised to the melting point of the bumps. As such, all bonding occurs during tacking at sub-melting point temperatures. This sub-melting point bonding operation is referred to as thermo-compression bonding. Since temperatures are below the melting point of the bumps, thermo-compression bonding produces a relatively weak bond. The bumps used for chip-on-chip applications therefore comprise a low temperature metal to effect the best bond possible under low temperature conditions.

Second, in chip-on-chip applications, the two chips being joined typically comprise dissimilar materials having different coefficients of thermal expansion. To avoid excessive thermal stresses upon cooling that might result in bond breakage, the tacking operation is performed at relatively low temperature (less than 100° C.). So, again, given such temperature limitations, low temperature metals will effect the best bonds.

And there is a third reason why low melting point metals are traditionally used for flip-chip bonding. In particular, it is very difficult to bring two chips (or a chip and a circuit board) together in perfectly parallel relation for bonding. Consequently, for both packaging and chip-on-chip applications, the bumps must be mechanically compliant (i.e., deformable) to accommodate the greater pressures exerted on some of the bumps when two parts are brought together out of parallel alignment.

Table I depicts a yield plot of a chip containing 256 photodetectors that are bonded to a silicon electronics chip (a chip-to-chip application) using high-temperature metal (in this case, gold) bumps. For the purposes of this specification, a "high-temperature metal" means metal(s) and metal alloys having a melting point above about 400° C. Illustrative high-temperature metals include, without limitation, gold, silver and chromium. In Table I, an "x" signifies no electrical connection, indicating a defective bump-to-bump bond, and "c" signifies a sound electrical connection.

TABLE I

Yield Plot of Chip

| C | C | C | C | C | C | X | C | X | X | X | X | X | X | X | X |
|---|---|---|---|---|---|---|---|---|---|---|---|---|---|---|---|
| C | C | C | C | C | C | C | X | C | X | X | X | X | X | X | X |
| C | C | C | C | C | C | X | C | X | X | X | X | X | X | X | X |
| C | C | C | C | C | C | X | X | X | X | X | X | X | X | X | X |
| C | C | C | C | C | C | X | X | C | X | X | X | X | X | X | X |
| C | C | C | C | C | C | X | C | C | C | X | X | X | X | X | X |
| C | C | C | C | C | C | C | C | C | X | X | C | X | X | X | X |
| C | C | C | C | C | C | C | C | X | C | X | X | X | X | X | X |
| C | C | C | C | C | C | C | C | X | X | X | C | X | X | X | X |
| C | C | C | C | C | C | C | C | C | C | X | X | X | X | X | X |
| C | C | C | C | C | C | C | C | X | C | X | C | X | X | X | X |
| C | C | C | C | C | C | C | C | X | X | X | X | X | X | X | X |
| C | C | C | C | C | X | X | X | X | X | X | C | X | X | X | X |
| C | C | C | C | C | C | C | C | C | X | X | X | X | X | X | X |
| C | C | C | C | C | C | C | C | C | C | X | C | X | X | X | X |
| C | C | C | C | C | C | C | C | C | C | C | C | C | X | X | X |

Referring to Table I, most of the bonds located on one side of the chip (appearing at the right side of Table I) are defective. These failures occurred, in large part, due to the inability of the high-temperature metal bumps to sufficiently deform when exposed to localized high pressure resulting from the non-parallel chip surfaces.

These considerations have prompted, if not dictated, the use of low-temperature metals for chip-on-chip applications. But the use of low-temperature metals is problematic. Specifically, if the assembled chips are operated or stored at elevated temperatures (i.e., at or above 100° C.), partial reflow of low-temperature metal bumps might occur, causing reliability problems. Also, when low-temperature metals are pressed against high-temperature metals (e.g., gold or aluminum contact pads, etc.), intermixing of metals does not reliably occur, resulting in low bond yield. For this reason, when using low-temperature metal bumps for flip-chip bonding, especially for chip-on-chip applications, bumps must be placed on both electronic parts (so that the contact is low-temperature-metal to low-temperature-metal) thereby increasing the likelihood of intermixing. But this disadvantageously increases fabrication cost.

Furthermore, low-temperature metals typically have a much lower thermal conductivity than high-temperature metals. For example, low temperature lead-indium solders have a thermal conductivity of about 0.22 watts per centimeter-Kelvin while high temperature silver has a thermal conductivity of about 4.2 W/cm-K. Consequently, low-temperature metals are not nearly as efficient for heat sinking flip-chip bonded devices.

And there is a fourth problem with using low-temperature metals for bumps. In particular, although it is possible to deposit low-temperature metal bumps that are small enough (i.e., have an area of about 10×10 microns and a height of 5–10 microns) for chip-on-chip applications, a contact pad of considerably larger size (e.g., 30×30 microns) is usually required since the bumps deform significantly during tacking. The larger size contact pads have a relatively large capacitance that results in relatively slower signal speeds. While slower signal speeds do not currently present a problem for many devices, this will become an issue as flip-chip bonding is used for high-speed devices.

For these reasons, a bump that is mechanically compliant, regardless of its metal composition, would benefit the art.

SUMMARY OF THE INVENTION

Some embodiments in accordance with the illustrative embodiment of the present invention provide a mechanically compliant bump that avoids some of the drawbacks of the prior art. In particular, such bumps are mechanically compliant even when they are formed of high-temperature metals.

A mechanically compliant bump in accordance with the illustrative embodiment of the invention includes a base, which is typically disposed on the contact pad of an electronics device. Depending from the periphery of an upper surface of the base is a wall that advantageously completely encircles the upper surface of the base. The wall is able to flex or deform under pressure, even when the wall is formed from high-temperature metal. The wall therefore provides mechanical compliance.

The mechanically compliant bump is tapered. That is, the width of the bump increases with increasing distance from the bottom surface of the base. The taper angle of the bump is in a range of about five to about thirty degrees.

In a method in accordance with the illustrative embodiment of the present invention, openings that are formed in a photoresist layer (for metal deposition) are reverse tapered. For the purposes of this specification, "reverse taper(ed)," as that phrase is used to described openings in a photoresist layer, means that the openings are wider at the upper surface of the photoresist layer than at the lower surface thereof. This decrease in width (with increasing proximity to the lower surface of the photoresist) is the reverse of the taper applied to openings that are used in the prior art (to form flip-chip bumps), which increase in width (with increasing proximity to the lower surface of the photoresist).

As a consequence of the reverse taper of openings used in a method in accordance with the illustrative embodiment of the present invention, metal that is deposited in the openings deposits against the side-walls thereof, unlike the prior art. The deposited metal fills the lower half (approximately) of the opening, forming the base of the mechanically compliant bump. Above the base, the metal forms a thin wall adjacent to the side-wall of the opening.

Since mechanically compliant bumps in accordance with the illustrative embodiment of the present invention are compliant even when they are formed from high temperature metal, the use of low-temperature metal, and the accompanying drawbacks thereof, can be avoided.

DETAILED DESCRIPTION

For the purposes of this specification, the following terms and phrases are defined as follows.

"Semiconductor chip" refers to diced portions of a semiconductor wafer. The semiconductor chip comprises a substrate, and circuitry disposed on/in the substrate that is capable of performing an electronics or hybrid electronics/photonics function. A semiconductor chip typically comprises silicon, germanium or a group III–V compound semiconductor such as, without limitation, gallium arsenide and indium phosphide.

"Photonics device" means a device or circuit that generates or processes an optical signal, including, without limitation, photodetectors, quantum well modulators and lasers. This term also refers to semiconductor chips that are formed from group III–V compound semiconductors and that contain device(s) or circuitry for generating or processing an optical signal.

"Silicon electronics" means electronic circuitry formed in/on a silicon chip, including, without limitation, drive circuitry, read-out circuitry, memory circuitry and processing circuitry.

"Electronics device" includes, without limitation, a circuit board; a semiconductor chip as defined above, a photonics device as defined above; and a semiconductor wafer.

"Low-temperature metal" means metal(s) or metal alloys having a melting point less than about 400° C. Illustrative low temperature metals include, without limitation, indium compositions, and certain alloys of tin, bismuth and zinc.

"High-temperature metal" means metal(s) and metal alloys having a melting point above about 400° C. Illustrative high-temperature metals include, without limitation, gold, silver and chromium.

"Reverse taper(ed)," as used to described openings in a photoresist layer, means that the openings are wider at the upper surface of the photoresist layer than at the lower surface thereof.

Figure 4:
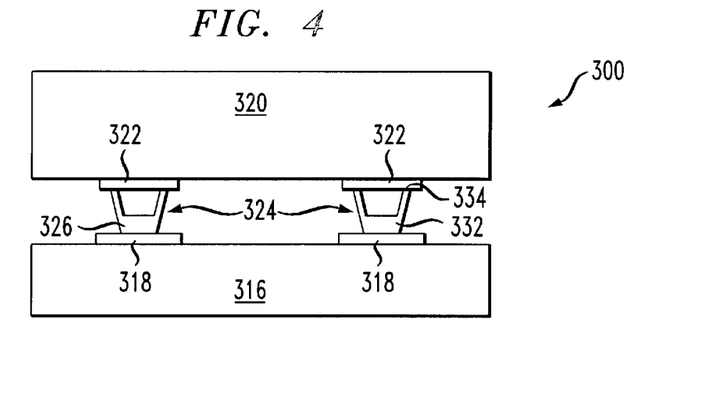
FIG. 4 depicts a cross-sectional view of an assemblage of two electronics devices that are physically and electrically attached by mechanically compliant bumps in accordance with the illustrative embodiment of the present invention.

FIG. 4 depicts, via cross-sectional view, two electronics devices 316 and 320 that are physically and electrically attached to one another by mechanically compliant bumps 324 in accordance with the illustrative embodiment of the present invention. For clarity of illustration, only two bumps 324 are depicted in FIG. 4; it will be understood, however, that typically many more bumps are used to physically attach and electrically attach electronics devices 316 and 320 to one another.

Base 326 of each mechanically compliant bump 324 is disposed on contact pad 318 of electronics device 316. Upper surface 334 of wall 332 of each mechanically compliant bump 324 engages contact pad 322 of second electronics device 320. As is known to those skilled in the art, under-bump metallurgy is advantageously deposited on contact pads 318 to improve adhesion as a function of the metallurgy of contact pads 318 and mechanically compliant bumps 324.

Figure 5:
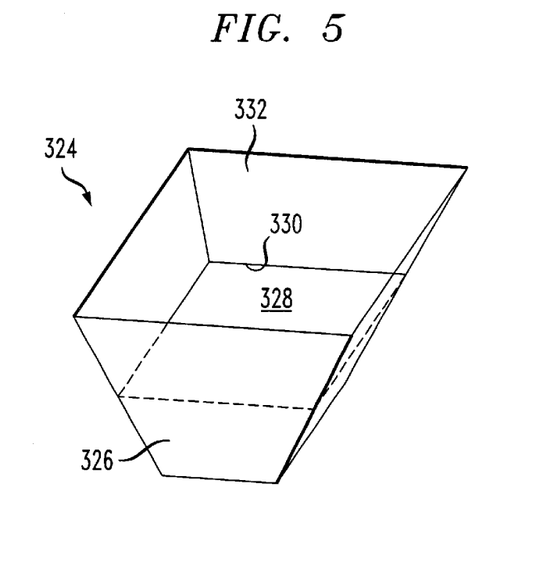
FIG. 5 depicts a perspective view of a mechanically compliant bump in accordance with the illustrative embodiment of the present invention.

Referring to FIG. 4 and a perspective view of a mechanically compliant bump that is depicted in FIG. 5, wall 332 depends from periphery 330 of upper surface 328 of base 326 of mechanically compliant bump 324 in accordance with the illustrative embodiment of the present invention. Wall 332 advantageously encloses or surrounds upper surface 328 of mechanically compliant bump 324. In other embodiments, wall 332 is not continuous. While mechanically compliant bump 324 is depicted in FIG. 5 as having a square or rectangular square cross-section, in other embodiments, the cross-section may have a different shape. For example, the cross-section can be, without limitation, hexagonal, octagonal or circular.

Wall 332 imparts mechanical compliance to bump 324. That is, wall 332 of bump 324 is able to flex or deform under pressure, even if it is formed from high-temperature metal. And the deformation of wall 332 increases in response to a greater applied pressure. Consequently, if second electronics device 320 is not parallel with first electronics device 316 when they are brought into contact for bonding, the bumps that are under greater pressure due to such misalignment will deform to a greater extent. This assures a sound bound at each bump 324 regardless of the applied pressure.

Figure 6:
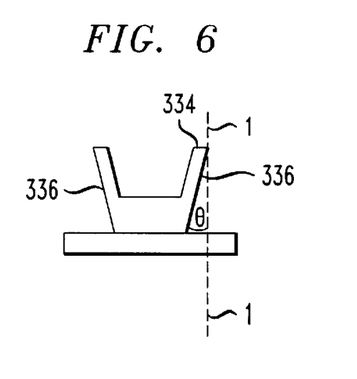
FIG. 6 depicts, via a cross-sectional view, a taper angle of a mechanically compliant bump in accordance with the illustrative embodiment of the present invention.

As shown in FIGS. 4–6, mechanically compliant bump 324 is tapered. That is, the width or diameter of mechanically compliant bump 324 increases with increasing distance from contact pad 318.

Referring to FIG. 6, the taper of mechanically compliant bump 324 is characterized by a taper angle θ. For the purposes of this specification, the phrase "taper angle," when used to refer to mechanically compliant bump 324, means the angle subtended between side 336 and "plum line" 1—1 passing through the outer edge of upper surface 334. As described in further detail later in this specification, the taper angle θ of mechanically compliant bump 324 is advantageously greater than about five degrees and not more than about thirty degrees.

Figure 7:
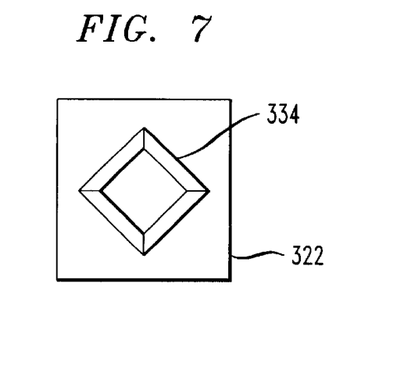
FIG. 7 depicts a view of a mechanically compliant bump in accordance with the illustrative embodiment of the present invention engaging a contact pad at a forty-five degree rotation with respect to the contact pad.

As depicted in FIG. 7, bump 324 is advantageously rotated 45 degrees with respect to contact pad 322 to relax the alignment tolerances therebetween.

Although useful for either chip-on-chip or packaging applications, mechanically compliant bump 324 is particularly useful in chip-on-chip applications for the significant advance it offers over the prior art. Regarding chip-on-chip applications, one class of devices of growing importance is hybrid devices wherein photonics devices are coupled to a silicon electronics chip. By way of illustration, not limitation, several such hybrid devices in accordance with the illustrative embodiment of the present invention are described below.

Example 1

Hybrid Device Comprising Photodetector Array and Read-Out Circuitry

A semiconductor photodetector creates electron hole pairs by absorbing optical energy. Materials suitable for use in photodetectors have an energy gap, $E_g$<h v, where h is Plank's constant and v is frequency, for an optical signal with energy h v. Suitable photodetector materials include, without limitation, and as a function of wavelength, silicon, silicon germanium, gallium arsenide, indium gallium arsenide, indium phosphide, indium gallium arsenide phosphide aluminum gallium antimony, lead selenium, indium arsenide, indium antimony and mercury cadmium tellurium. Those skilled in the art will be able to suitable select a material as a function of the intended operating wavelength of the photodetector. See H. P. Zappe, *Introduction to Semiconductor Integrated Optics,* (Artech House, ©1995), pp 271–290.

Photodetectors can be configured as surface detectors (i.e., incident light is perpendicular to the materials layers that comprise the detector) or as waveguide detectors (i.e., incident light is parallel to the material layers that comprise the detector). Either configuration can be used in conjunction with the illustrative embodiment of the present invention. Furthermore, any of a variety of different types of photodetectors are suitably used in conjunction with the illustrative embodiment of the present invention. Illustrative types of photodetectors include, without limitation, p-i-n diodes, Schottky barrier photodiodes and avalanche photodiodes.

Figure 8:
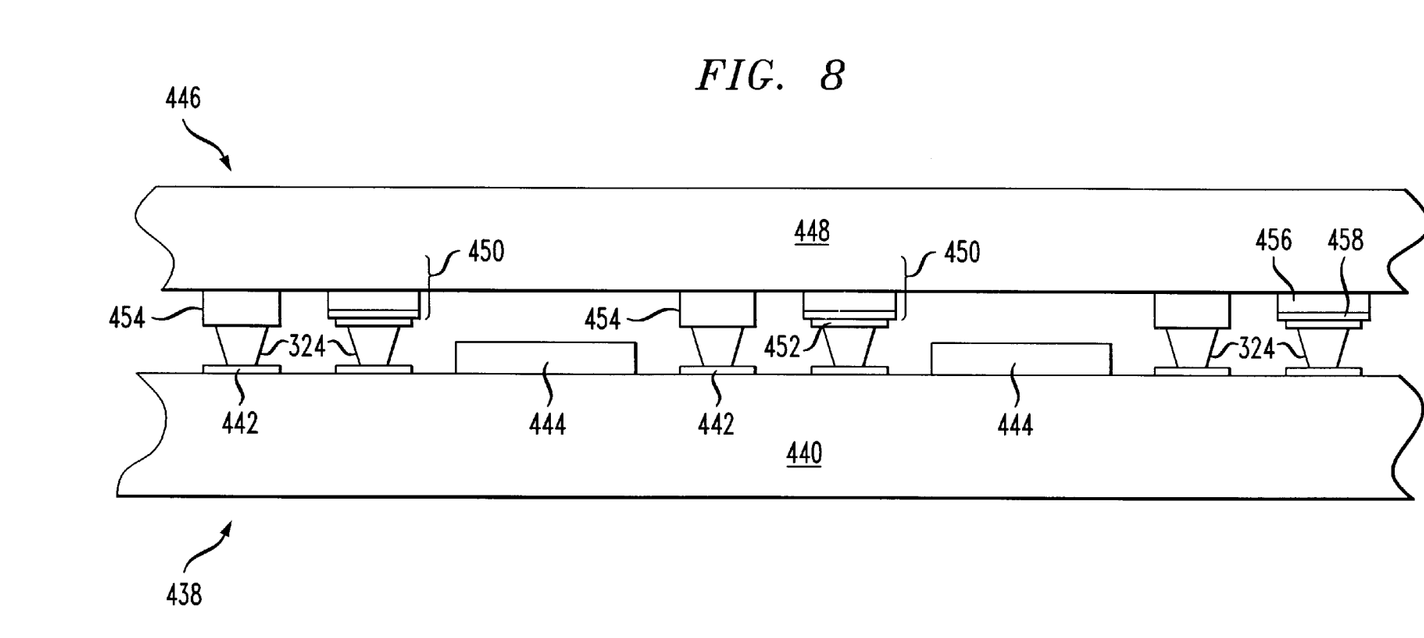
FIG. 8 depicts a hybrid device wherein mechanically compliant bumps are used to attach a photonics chip having photodetectors to a silicon electronics chip having read-out circuitry in accordance with the illustrative embodiment of the present invention.

FIG. 8 depicts a first embodiment of a hybrid chip 400 in accordance with the illustrative embodiment of the present invention. In the embodiment depicted in FIG. 8, hybrid chip 400 comprises silicon electronics chip 438 that is attached, via mechanically compliant bumps 324, to a photonics chip 446.

Silicon electronics chip 438 comprises silicon substrate 440. Contact pads 442 and silicon electronics, such as, for example, read-out circuitry 444, are disposed on substrate 440. Photonics chip 446 comprises substrate 448. An array of p-i-n photodiodes 450, three of which are shown in FIG. 8, and contact pads 454 are disposed on substrate 448. Contact pads 452 are disposed on p-i-n photodiodes 450.

In one embodiment, diode array depicted in FIG. 8 comprises an indium gallium arsenide on InP surface mesa p-i-n detector operable to detect an optical signal through substrate 448. In this embodiment, p-i-n diode 450 comprises substrate 448, which is n-doped indium phosphide, layer 456 of undoped or intrinsic ("i") indium gallium arsenide disposed on substrate 448, and layer 458 of p-doped indium phosphide on layer 456. Those skilled in the art can readily fabricate photonics chip 444 and silicon electronics chip 438 comprising read-out circuitry 444.

Example 2

Hybrid Device Comprising VCSEL Array & Drive Circuitry

Surface-emitting lasers (SELs), which direct optical energy normal to the wafer surface, have many advantageous features and are readily fabricated into two-dimensional arrays with individual addressing for free space data transmission. One group of SELs is the vertical cavity surface-emitting lasers (VCSELs). VCSELs use a multilayer stack of deposited dielectrics or epitaxially grown layers as a Bragg reflector. The active region of a VCSEL usually has a length on the order of several nanometers to a micron and the Bragg mirrors have a typical total thickness on the order of one micron. The entire VCSEL is therefore only several microns in length.

The Bragg stacks are formed from alternating layers of either dielectrics, such as silicon dioxide/silicon, or silicon dioxide/titanium dioxide, or, more typically, epitaxially grown semiconductors, such as aluminum arsenide/gallium arsenide. The stacks tyically include between about fifteen to thirty layers or periods. The refractive index differences in the two constituent materials of the stack form a vertical Bragg reflector, and the relative layer thickness for each material is chosen for a particular oscillation wavelength.

Once the Bragg mirrors surrounding the active region are fabricated, the device is laterally defined by implantation, oxidation or by etching a mesa. Current injection into the active region is typically though the mirrors. See H. P. Zappe, *Introduction to Semiconductor Integrated Optics,* (Artech House, ©1995), pp 264–267.

Figure 9:
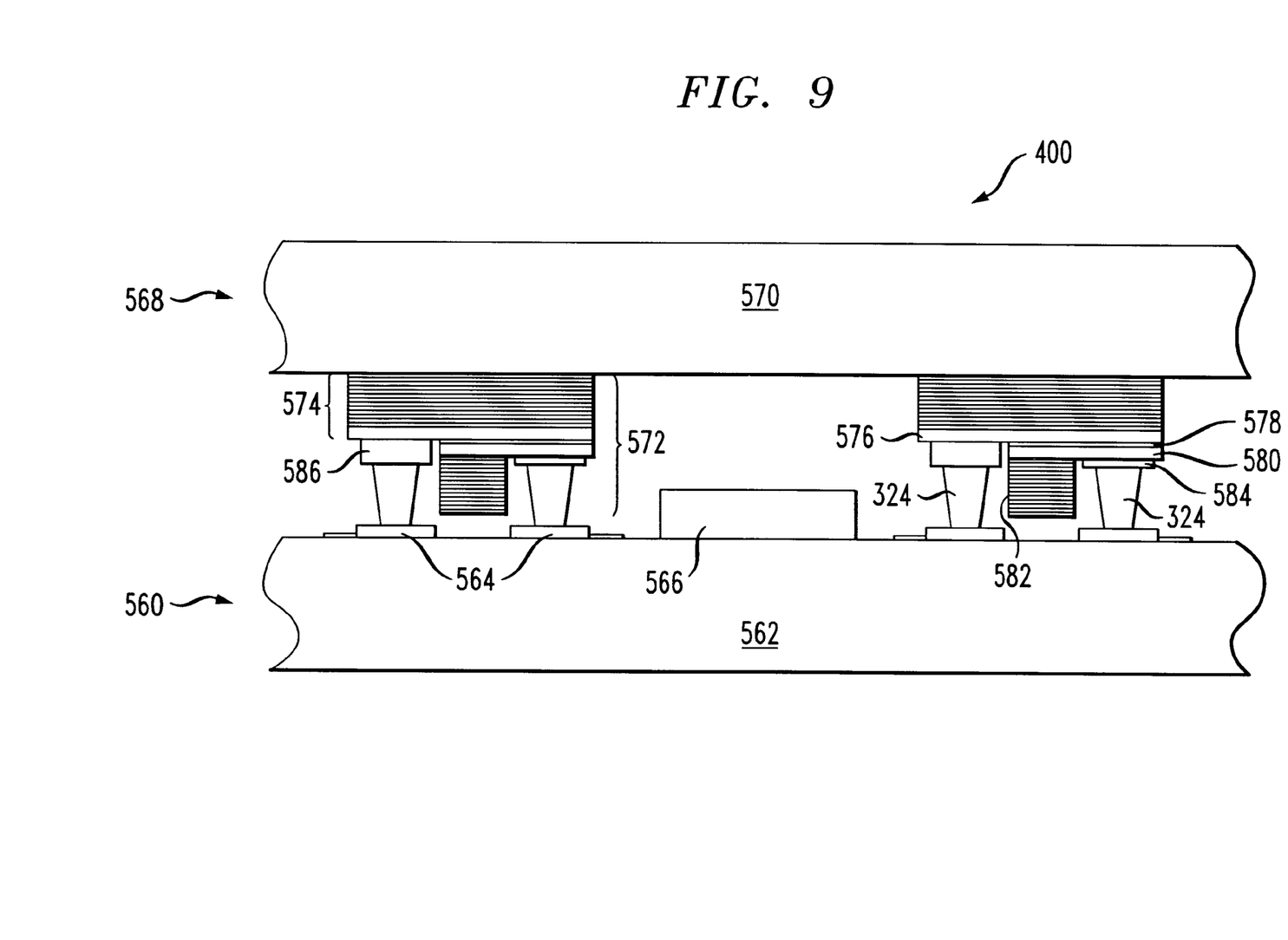
FIG. 9 depicts a hybrid device wherein mechanically compliant bumps are used to attach a photonics chip having VCSELs to a silicon electronics chip having driver circuitry in accordance with the illustrative embodiment of the present invention.

FIG. 9 depicts a second embodiment of a hybrid chip 400 in accordance with the illustrative embodiment of the present invention. In the embodiment depicted in FIG. 9, hybrid chip 400 comprises silicon electronics chip 560, which is attached, via mechanically compliant bumps 324, to a photonics chip 568.

Silicon electronics chip 560 comprises substrate 562. Contact pads 564 and silicon electronics, such as, for example, VCSEL driver circuitry 566, are disposed on substrate 562. Photonics chip 568 comprises substrate 570, and an array of VCSELs 572 that are disposed thereon. For clarity of illustration, only two VCSELs 572 are depicted in FIG. 9. It will be appreciated that in most embodiments, many more VCSELs are typically present.

VCSEL 572 comprises top mirror (i.e., Bragg stack) 574, p-doped layer 576, undoped layer 578, n-doped layer 580 and bottom mirror 582, arranged as shown. Bottom mirror 582 is similar in composition to top mirror array 574, but higher in overall reflectivity.

Contact pads 584 and 586 are disposed on each VCSEL 572. Mechanically compliant bumps 324, which are formed on contacts pads 564, are bonded to contact pads 584 and 586 thereby attaching chip 560 to chip 568 to form hybrid device 400 in accordance with the illustrative embodiment of the present invention. Those skilled in the art can readily fabricate photonics chip 568 and silicon electronics chip 560 comprising driver circuitry 566.

Example 3

Hybrid Device Comprising Co-located Photodetector & Laser Arrays and Drive and Read-out Circuitry In Example 1, photonics chip 446, including substrate 448, form a part of hybrid device 400. Similarly, in Example 2, photonics chip 568, including substrate 570, form a part of hybrid device 400. In an alternative embodiment, such as the one described in this Example, the substrate of the photonics chip does not remain attached to hybrid device 400.

Figure 10:
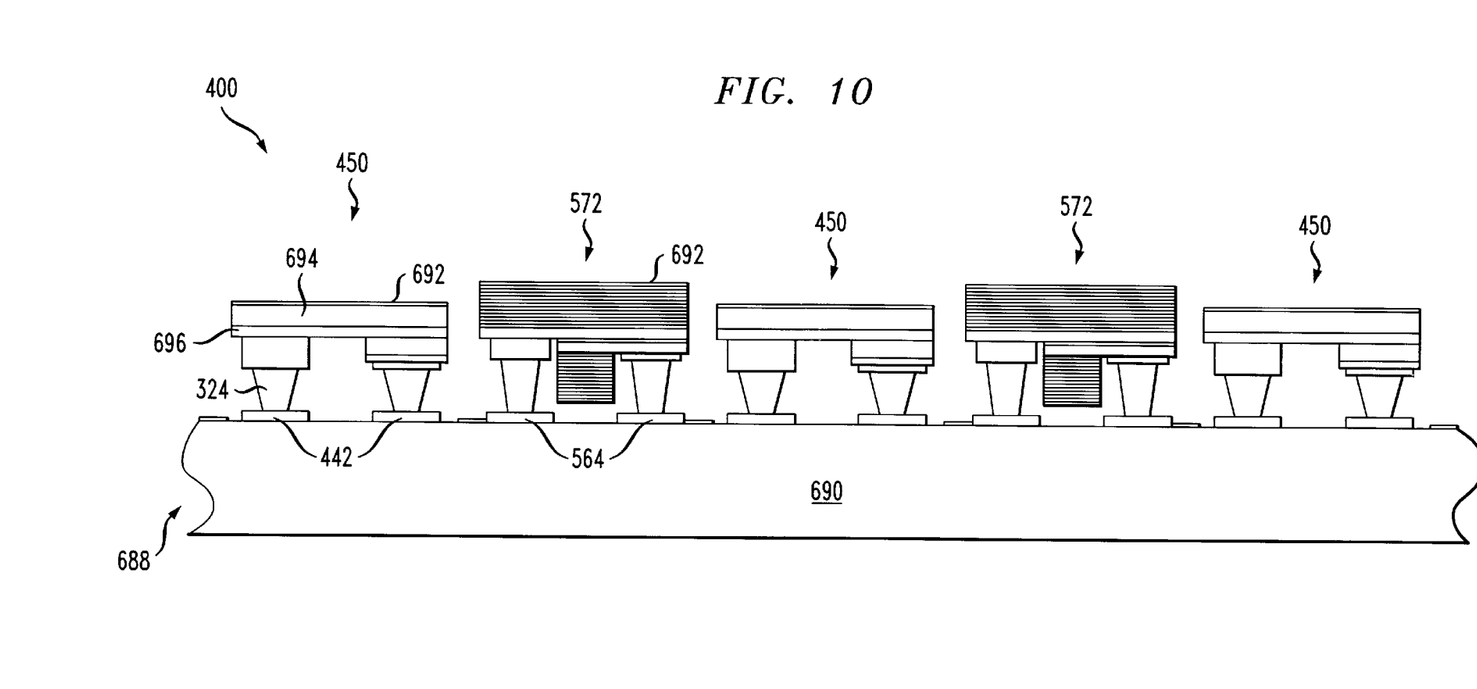
FIG. 10 depicts a hybrid device wherein mechanically compliant bumps are used to attach photodetectors and VCSELs to a silicon electronics chip having read-out circuitry and driver circuitry in accordance with the illustrative embodiment of the present invention

Hybrid device 400 in accordance with the illustrative embodiment of the present invention comprises co-located photonics devices. In the embodiment described in this Example, the photonics devices, which include photodetectors 450 and VCSELs 572, are attached to semiconductor chip 688 by mechanically compliant bumps 324. The substrates that were originally attached to the photonics devices have been removed, such as by the method described in U.S. Pat. No. 5,858,814, incorporated by reference herein. Consequently, anti-reflection layer 692 is advantageously deposited on the uppermost layer of photodetectors 450 and VCSELs 572.

As part of the method described in U.S. Pat. No. 5,858,814, stop-etch layer 694 remains attached to photodetectors 450. Layer 696 is the p-doped layer of photodetectors 450, which are configured as p-i-n diodes. For clarity, the electronics on silicon electronics chip 688, which includes read-out circuitry for photodetectors 450 and drive circuitry for VCSELs 572, is not depicted.

Figure 11:
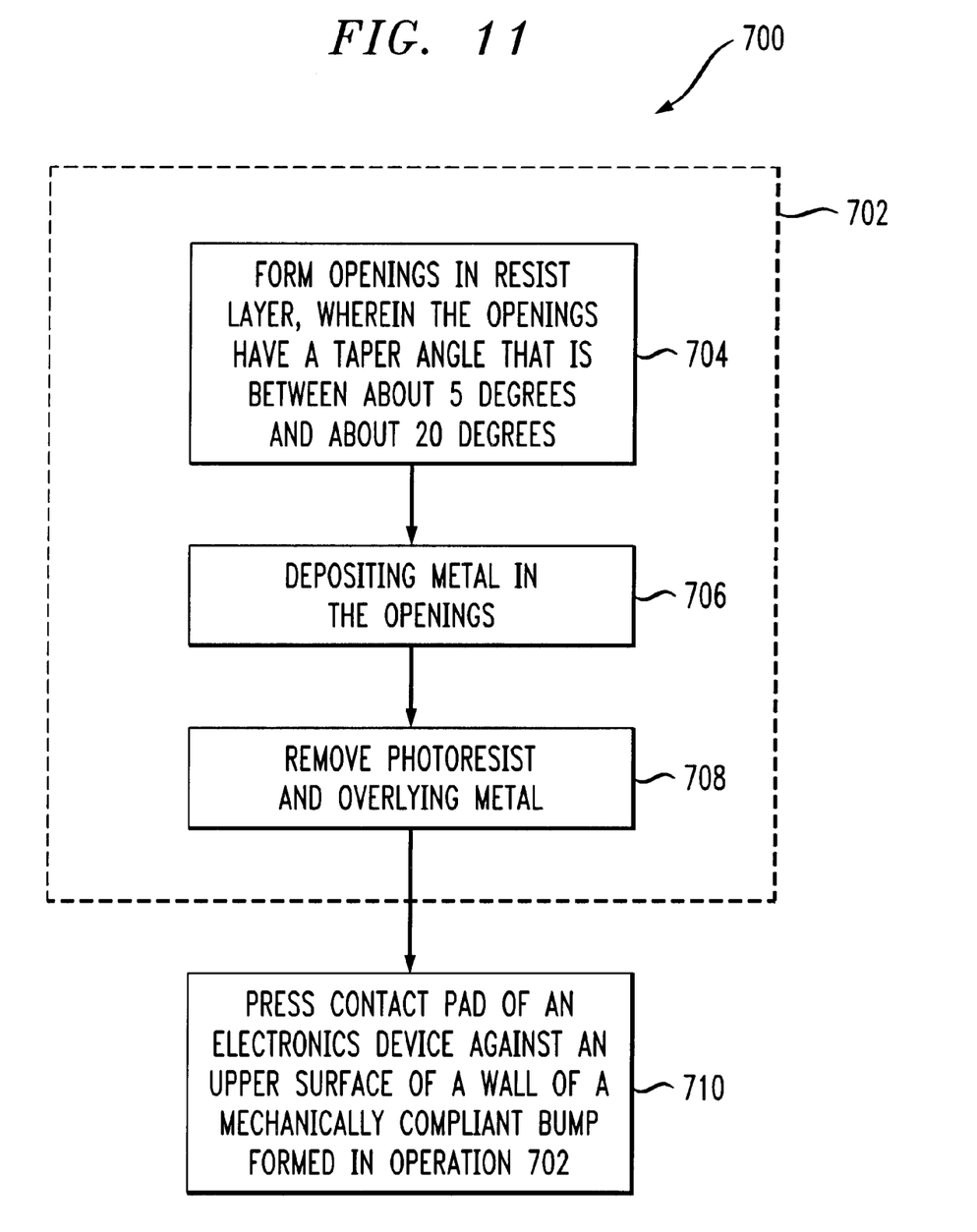
FIG. 11 depicts a method in accordance with the illustrative embodiment of the present invention.

Method 700 in accordance with the illustrative embodiment of the present invention is depicted, via flow diagram, in FIG. 11. Operation 702 comprises forming mechanically compliant bumps 324, and operation 710 comprises forming a hybrid device or other assemblage using mechanically compliant bumps 324. The description of method 700 proceeds with reference to FIGS. 12–15.

Figure 12:
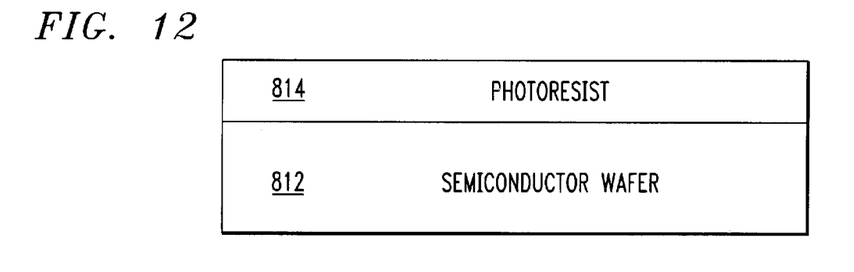
FIG. 12 depicts a cross-sectional view of a wafer with resist deposited thereon.

As in the method for forming conventional flip-chip bumps, photoresist is flowed onto an electronics device, such as semiconductor wafer, and then the device is spun to produce a uniform thickness of photoresist. FIG. 12 depicts wafer 812 with a uniform thickness of photoresist 814 deposited thereon.

Figure 13:
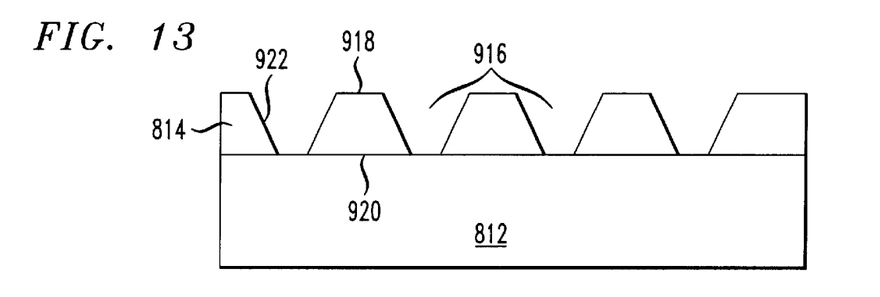
FIG. 13 depicts the resist layer of FIG. 12 patterned for metal deposition, in accordance with the illustrative embodiment of the present invention.

In accordance with operation 704, openings are formed in the photoresist layer using standard photolithographic procedures. FIG. 13 depicts openings 916 that have been formed in photoresist layer 814.

In accordance with the illustrated embodiment of the present invention, openings 916 are reverse tapered (i.e., wider at upper surface 918 than at lower surface 920). The reverse taper is achieved, in one embodiment, by underexposing the resist, such as by prematurely ending the exposure period.

Figure 14:
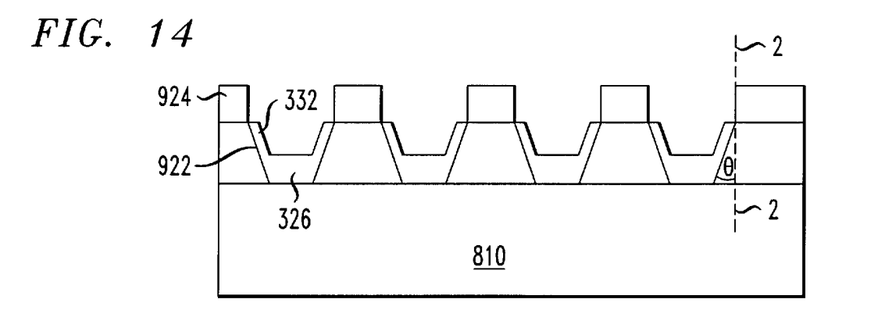
FIG. 14 depicts a cross-sectional view of the wafer and patterned resist layer of FIG. 13 with metal deposited thereon.

Reverse-tapered openings 916 produced via method 700 are to be contrasted with the tapered openings formed via the conventional bump-forming process, which taper from narrower to wider proceeding into the photoresist layer, such as depicted in FIGS. 1 and 2. As a consequence of the reverse taper of openings 916, metal that is deposited therein, as per operation 706, deposits against side-walls 922. Metal deposition proceeds in known fashion using methods available in the prior art. FIG. 14 depicts metal deposited within openings 916, wherein, above base 326, metal deposits in the form of thin wall 332.

Metal need not be directed toward side-wall 922 of openings 916. In fact, no deviation from conventional metal deposition procedures is required for operation 706. Thin wall 332 forms as a consequence of the reverse taper of side-wall 922. Since the openings in the photoresist are not reverse tapered (see FIG. 2) in the prior art, metal does not form on the side-walls.

Unlike the prior art, illustrative method 700 does not provide a significant gap between side-wall 922 of openings 916 and metal "bump" 324 (see, gap 214 in FIG. 2) for the purpose of allowing solvent to penetrate down to the surface of wafer 812 to remove the photoresist and lift-off the overlying metal. Even without such a gap, solvent penetrates between the deposited metal and side-wall 922, albeit at a slower rate.

Taper angle $\theta$ of opening 916 is defined in FIG. 14 as the angle subtended between side-wall 922 and "plum-line" 2—2. Taper angle $\theta$ of opening 916 is equal, of course, to taper angle $\theta$ of mechanically compliant bump 324 (see FIG. 14).

Taper angle $\theta$ of opening 916 should not exceed about thirty degrees. When taper angle $\theta$ of opening 916 substantially exceeds thirty degrees, solvent does not properly penetrate between sidewall 922 of opening 916 and the adjacent metal that forms the exterior of mechanically compliant bump 324. Furthermore, taper angle $\theta$ of opening 916 should not be less than about five degrees. When taper angle $\theta$ of opening 916 is less than about five degrees, wall 332 is too thin to reliably support itself. Under such conditions, wall 332 tends to break off during processing.

It was previously disclosed that taper angle $\theta$ is created, and varied, as a function of the degree to which the photoresist is underexposed. The parameters that determine the photoresist exposure time (e.g., the intensity of the illumination, the specific photoresist used, the thickness of the photoresist layer, etc.) will of course vary from laboratory to laboratory. Consequently, exposure time to achieve a desired taper angle $\theta$ (i.e., within the range of about five to about thirty degrees) is best determined by simple experimentation, which is within the capabilities of those skilled in the art.

Even when taper angle $\theta$ is greater than five degrees, wall 332 will be too thin to support itself unless a minimum amount of metal is deposited. It has been found that when the thickness (i.e., depth) of base 326 is at least about 2.5 microns, wall 332 has sufficient thickness to reliably support itself.

The present method can be used to form low-temperature metal bumps or high-temperature metal bumps. Mechanically-compliant bumps in accordance with the illustrative embodiment of the present invention advantageously comprise metals in addition to the primary structural metal. In particular, in some embodiments, a mechanically-compliant bump comprises at least one metal selected for its ability to adhere well to the metallurgy of the contact pad. For example, if the contact pads are aluminum, metals such as titanium or chromium are suitably used to promote adhesion. It is within the capabilities of those skilled in the art to select metal(s) for the purpose of adhering to the contact pads as a function of contact-pad metallurgy and bump metallurgy.

Furthermore, in some embodiments, a mechanically-compliant bump comprises at least one metal, such as gold, that is selected for its ability to resist corrosion, oxidation and like processes. It is within the capabilities of those skilled in the art to select metal(s) for the purpose of reducing oxidation as a function of metallurgy of the mechanically-compliant bump.

One recipe that has been found to be suitable for producing a high-temperature metal mechanically-compliant bump is to deposit, on aluminum contact pads, 0.15 microns of titanium (to promote adhesion), followed by 3 microns of silver, followed by 0.1 microns of gold (to prevent tarnishing). Using this recipe, mechanically compliant bumps were formed on a silicon electronics chip, and then used to bond that chip to a chip containing 256 photodetectors. Subsequent analysis showed 100 percent yield (i.e., sound electrical connection for each detector), unlike the experiment that was run with prior art high-temperature metal bumps (see Table 1 in the Background section of this specification).

Figure 15:
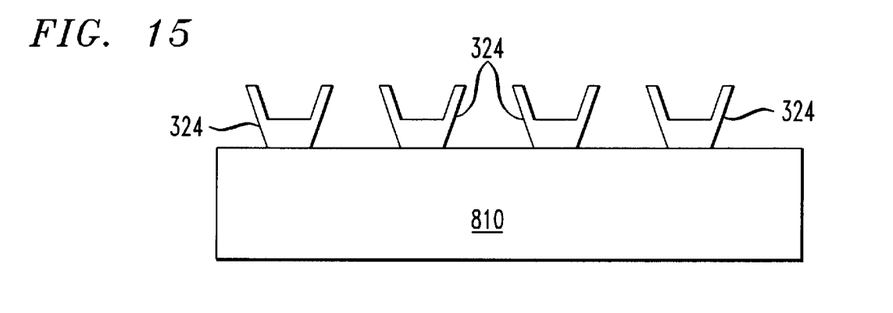
FIG. 15 depicts a cross-sectional view of the wafer of FIG. 13 with the resist and overlying metal removed, leaving mechanically compliant bumps.

In operation 708, photoresist 814 and metal 924 that deposited on upper surface 918 of photoresist layer 814 are removed with a suitable solvent, such as acetone, in known fashion. Mechanically compliant bumps 324 remain, as depicted in FIG. 15. This completes bump-formation operation 702.

Once the requisite number of mechanically complaint bumps 324 are formed on an electronics device, the contact pads of a second electronics device are brought in contact therewith (tacking), in accordance with operation 710. As previously described, thermo-compression bonding occurs to form an assemblage of the two electronics devices.

In some embodiments, an underfill material, such as a thermosetting polymer (e.g. an epoxy, etc.), is applied to one or both of the surfaces that are being joined by mechanically compliant bumps 324. The underfill material, which is applied before the surfaces (e.g., two semiconductor chips, etc.) are brought together for tacking/thermo-compression bonding, fills the gap (that results from the presence of mechanically compliant bumps 324) between the surfaces. The underfill provides additional bonding for the assemblage, which is particularly advantageous in embodiments in which mechanically complaint bumps 324 are formed from high-temperature metals. The underfill material is suitably applied in accordance with the method disclosed in U.S. Pat. No. 5,975,408, incorporated by reference herein.

As previously indicated, method 700 can be used to attach a semiconductor chip to a circuit board, another semiconductor chip, or simply to devices, such as, without limitation, lasers, or photodetectors, by removing the substrate to which the lasers or photodetectors are attached.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

We claim:

1. An article comprising a mechanically compliant bump, said mechanically compliant bump having:
   a base comprising a first metal, wherein a lower surface of said base is deposited on a contact pad; and
   a wall depending from a periphery of an upper surface of said base, said wall comprising said first metal, wherein:
   a width of said mechanically compliant bump increases with increasing distance from said lower surface of said base toward an upper surface of said wall.

2. The article of claim 1 wherein said increase in width of said mechanically compliant bump defines a taper, said taper characterized by a taper angle that is at least about five degrees.

3. The article of claim 1 wherein said increase in width of said mechanically compliant bump defines a taper, said taper characterized by a taper angle that is not more than about thirty degrees.

4. The article of claim 1 wherein said increase in width of said mechanically compliant bump defines a taper, said taper characterized by a taper angle that is at least about 5 degrees and not more than about thirty degrees.

5. The article of claim 1 wherein said base has a thickness of at least about 2.5 microns.

6. The article of claim 1 wherein said first metal is silver.

7. The article of claim 1 wherein said base and said wall comprise a second metal that is selected for an ability to adhere to said contact pad.

8. The article of claim 7 wherein said contact pad comprises aluminum and said second metal comprises titanium.

9. The article of claim 7 wherein said first metal is silver and said second metal is titanium.

10. The article of claim 9 wherein said base and said wall comprise a third metal, wherein said third metal is gold.

11. The article of claim 1 further comprising a first electronics device, wherein said contact pad is disposed on said first electronics device.

12. The article of claim 11 further comprising a second electronics device, wherein an upper surface of said wall abuts said second electronics device.

13. The article of claim 12 wherein said first electronics device comprises read-out circuitry and said second electronics device comprises a photodetector array.

14. The article of claim 12 wherein said first electronics device laser driver circuitry and said second electronics device comprises an array of surface emitting lasers.

15. An article comprising a mechanically compliant bump, said mechanically compliant bump comprising:
   a base electrically connected to an electronics device; and
   a wall depending from a periphery of an upper surface of said base, said wall encircling said upper surface of said base;
   wherein a width of said mechanically compliant bump increases with increasing distance from a lower surface of said base toward an upper surface of said wall, said increase in width defining a taper, said taper characterized by a taper angle that is at least about 5 degrees and not more than about thirty degrees.

16. The article of claim 15 wherein said mechanically compliant bump comprises high temperature metals.

17. The article of claim 15 wherein said electronics device comprises a first semiconductor chip, said article further comprising a second semiconductor chip that is attached to an upper surface of said wall.

18. The article of claim 15 wherein said taper angle is not more than about twenty degrees.

* * * * *